(12) United States Patent
Wang

(10) Patent No.: US 11,923,676 B2
(45) Date of Patent: Mar. 5, 2024

(54) METHOD FOR IDENTIFYING ELEMENT FAILURE IN CAPACITOR BANKS

(71) Applicant: MHO TECHNOLOGIES CORP., Calgary (CA)

(72) Inventor: Haijie Wang, Calgary (CA)

( * ) Notice: Subject to any disclaimer, the term of this patent is extended or adjusted under 35 U.S.C. 154(b) by 321 days.

(21) Appl. No.: 17/400,907

(22) Filed: Aug. 12, 2021

(65) Prior Publication Data

US 2023/0052911 A1 Feb. 16, 2023

(51) Int. Cl.
*H02H 7/16* (2006.01)
*H02H 3/04* (2006.01)
*H02H 3/353* (2006.01)

(52) U.S. Cl.
CPC .............. *H02H 7/16* (2013.01); *H02H 3/042* (2013.01); *H02H 3/353* (2013.01)

(58) Field of Classification Search
CPC .......... H02H 7/16; H02H 3/042; H02H 3/353; H02H 3/402; H02H 3/343; G01R 27/16; G01R 31/64; G01R 31/52

USPC ......................................................... 324/521
See application file for complete search history.

(56) References Cited

U.S. PATENT DOCUMENTS

| | | | | |
|---|---|---|---|---|
| 2013/0338946 A1* | 12/2013 | Gajic | ..................... | G01R 31/64 |
| | | | | 702/58 |
| 2015/0355259 A1* | 12/2015 | Sartler | .................. | H02M 1/126 |
| | | | | 324/548 |
| 2019/0245458 A1* | 8/2019 | Wang | .................. | H02M 7/4826 |

* cited by examiner

*Primary Examiner* — Farhana A Hoque
(74) *Attorney, Agent, or Firm* — Finch & Maloney PLLC

(57) ABSTRACT

A method for identifying element failure in capacitor banks is provided. Capacitor bank phase current is measured and a zero-sequence or negative-sequence current is calculated or measured. A three-phase voltage is measured from a three-phase bus voltage transformer and a zero-sequence voltage or negative-sequence voltage is calculated. A compensated unbalance current is calculated and compared to a predetermined acceptable range. A failure is identified where the compensated unbalance current is outside the predetermined acceptable range.

23 Claims, 4 Drawing Sheets

METHOD FOR IDENTIFYING ELEMENT FAILURE IN CAPACITOR BANKS

FIELD OF THE DISCLOSURE

The present application relates generally to a method for identifying element failure in capacitor banks. More particularly, it relates to a method for identifying element failure in wye grounded capacitor banks.

BACKGROUND

This section provides background information to facilitate a better understanding of the various aspects of the invention. It should be understood that the statements in this section of this document are to be read in this light, and not as admissions of prior art.

In modern power systems, grounded wye shunt capacitor banks are commonly installed. Single and double capacitor banks are common variations of grounded wye shunt capacitor banks. Large capacitor banks usually consist of a plurality of capacitor units connected in parallel and/or series. Each unit consists of many capacitor elements that connect in parallel or series. Element failure is a common type of failure for capacitor banks. If not detected and cleared promptly, the risk of element failure may result in increasing voltage stress to the remaining healthy units in the same string. This can cause additional damage or cascading failure of a capacitor bank.

BRIEF SUMMARY

There is provided a method for identifying element failure in capacitor banks. A capacitor bank phase current is measured and use to calculate a zero-sequence current. A three-phase voltage from a three-phase bus voltage transformer is measured and used to calculate a zero-sequence voltage. A compensated unbalance current is calculated using a predetermined capacitor bank nominal impedance number, the zero-sequence current, and the zero-sequence voltage. The compensated unbalance current is compared to a predetermined acceptable range. A capacitor bank element failure is identified when the compensated unbalance current is outside the predetermined acceptable range.

In one embodiment, a further step of applying an analog filter to the capacitor bank phase current is completed.

In another embodiment, a further step of applying a digital filter to the capacitor bank phase current is completed.

In one embodiment, a further step of applying an analog filter to the three-phase voltages is completed.

In another embodiment, a further step of applying a digital filter to the three-phase voltages is completed.

In one embodiment, the predetermined capacitor bank nominal impedance number is a predetermined number specified at the time of building the capacitor bank and is dependent on the specifications of each capacitor bank. The capacitor bank nominal impedance number is identifiable by a person skilled in the art.

In one embodiment, a further step of setting off an alarm or trip when the capacitor bank element failure is identified is completed.

In one embodiment, a further step of applying a time delay prior to setting off the alarm or trip to avoid a false alarm or trip is completed.

In one embodiment, the predetermined acceptable range of the compensated unbalance current is precalculated by an electrical engineer.

There is also provided a method for identifying element failure in capacitor banks. A zero-sequence current is measured using a current transformer installed on a conductor between a capacitor bank neutral and a capacitor bank ground. A three-phase voltage from a three-phase bus voltage transformer is measured and used to calculate a zero-sequence voltage. A compensated unbalance current is calculated using a predetermined capacitor bank nominal impedance number, the zero-sequence current, and the zero-sequence voltage. The compensated unbalance current is compared to a predetermined acceptable range. A capacitor bank element failure is identified when the compensated unbalance current is outside the predetermined acceptable range.

In one embodiment, a further step of setting off an alarm or trip when the capacitor bank element failure is identified is completed.

In one embodiment, a further step of applying a time delay prior to setting off the alarm or trip to avoid a false alarm or trip is completed.

In one embodiment, the predetermined acceptable range of the compensated unbalance current is precalculated by an electrical engineer.

There is also provided a method for identifying element failure in capacitor banks. A capacitor bank phase current is measured and use to calculate a negative-sequence current. A three-phase voltage from a three-phase bus voltage transformer is measured and used to calculate a negative-sequence voltage. A compensated unbalance current is calculated using a predetermined capacitor bank nominal impedance number, the negative-sequence current, and the negative-sequence voltage. The compensated unbalance current is compared to a predetermined acceptable range. A capacitor bank element failure is identified when the compensated unbalance current is outside the predetermined acceptable range.

In one embodiment, a further step of applying an analog filter to the capacitor bank phase current is completed.

In another embodiment, a further step of applying a digital filter to the capacitor bank phase current is completed.

In one embodiment, a further step of applying an analog filter to the three-phase voltages is completed.

In another embodiment, a further step of applying a digital filter to the three-phase voltages is completed.

In one embodiment, the predetermined capacitor bank nominal impedance number is a predetermined number specified at the time of building the capacitor bank and is dependent on the specifications of each capacitor bank. The capacitor bank nominal impedance number is identifiable by a person skilled in the art.

In one embodiment, a further step of setting off an alarm or trip when the capacitor bank element failure is identified is completed.

In one embodiment, a further step of applying a time delay prior to setting off the alarm or trip to avoid a false alarm or trip is completed.

In one embodiment, the predetermined acceptable range of the compensated unbalance current is precalculated by an electrical engineer.

BRIEF DESCRIPTION OF THE DRAWINGS

These and other features will become more apparent from the following description in which references are made to the following drawings, in which numerical references denote like parts. The drawings are for the purpose of illustration only and are not intended to in any way limit the scope of the invention to the particular embodiments shown.

DETAILED DESCRIPTION OF THE PREFERRED EMBODIMENTS

A method for identifying element failure in capacitor banks will now be described with reference to FIG. 1 through FIG. 4.

The modern digital relay usually has currents (CTs) and voltages (VTs) related to the protected equipment wired into it. The digital relay then uses hardware and software filters, and other means of digital processing methods to process the AC inputs turns the analog input into digital signals—phasor quantities—at the power frequency. The digital relay can produce positive-sequence, negative-sequence, and zero-sequence quantities from the phase quantities using the symmetrical component method. Among the three sequential analog quantities, the Negative-sequence and Zero-sequence analogs can reflect a system unbalance condition.

Figure 1:
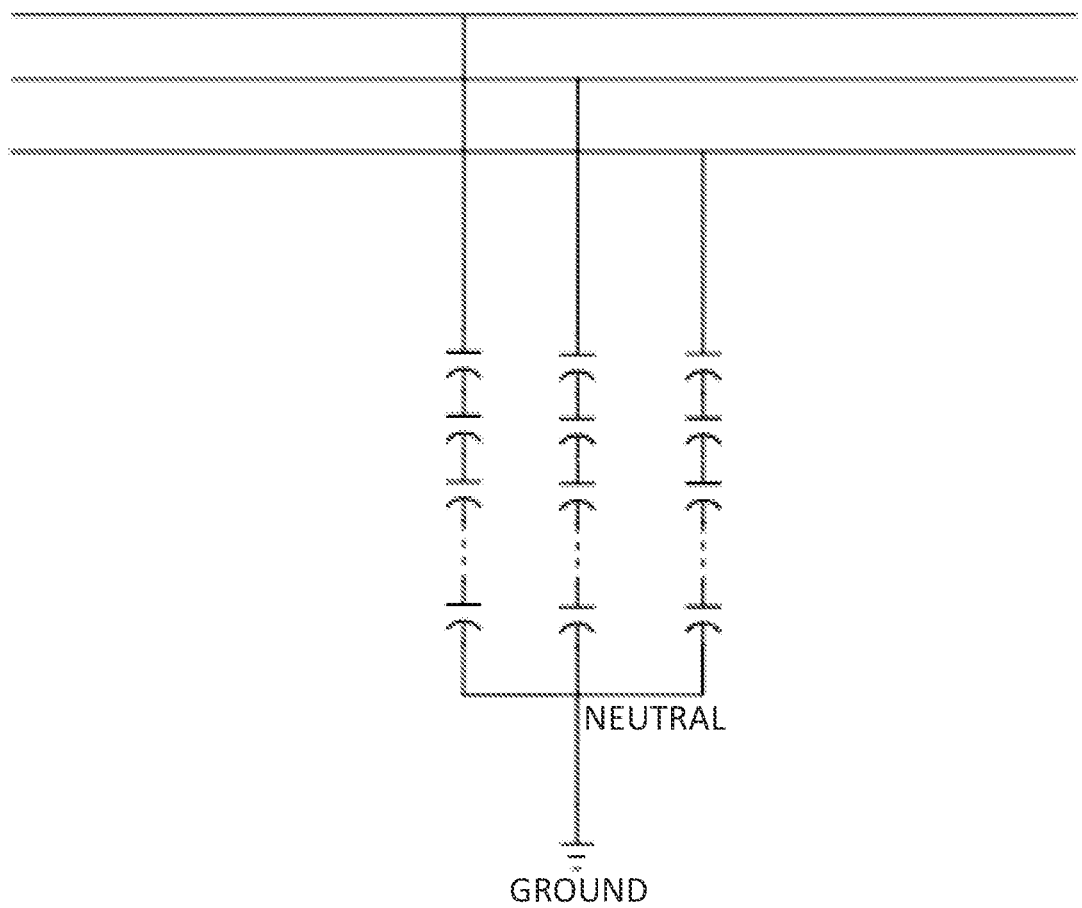
FIG. 1 is a schematic view of a WYE grounded capacitor bank.
Figure 2:
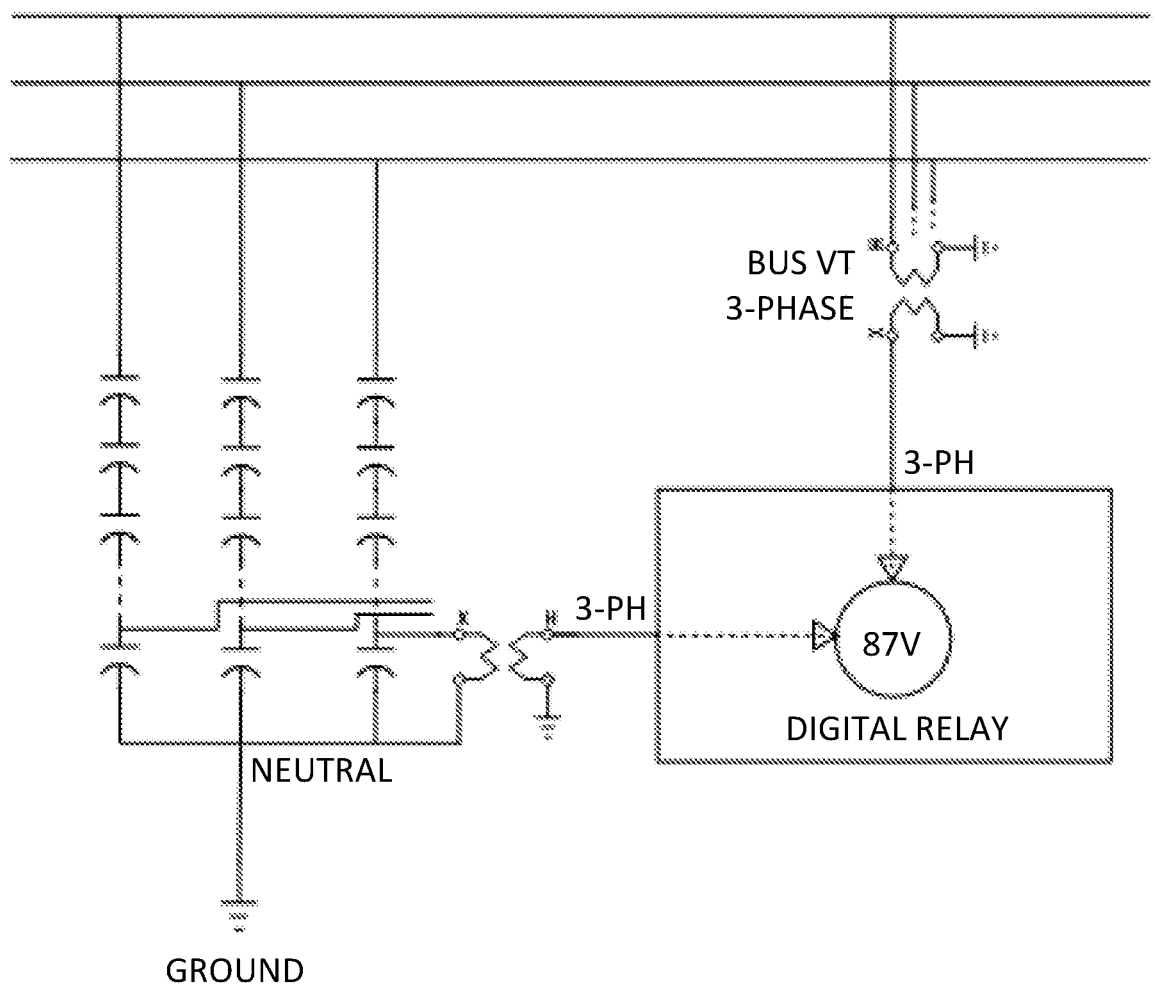
FIG. 2 is a schematic view of a prior art WYE grounded capacitor bank unbalance protection.
Figure 3:
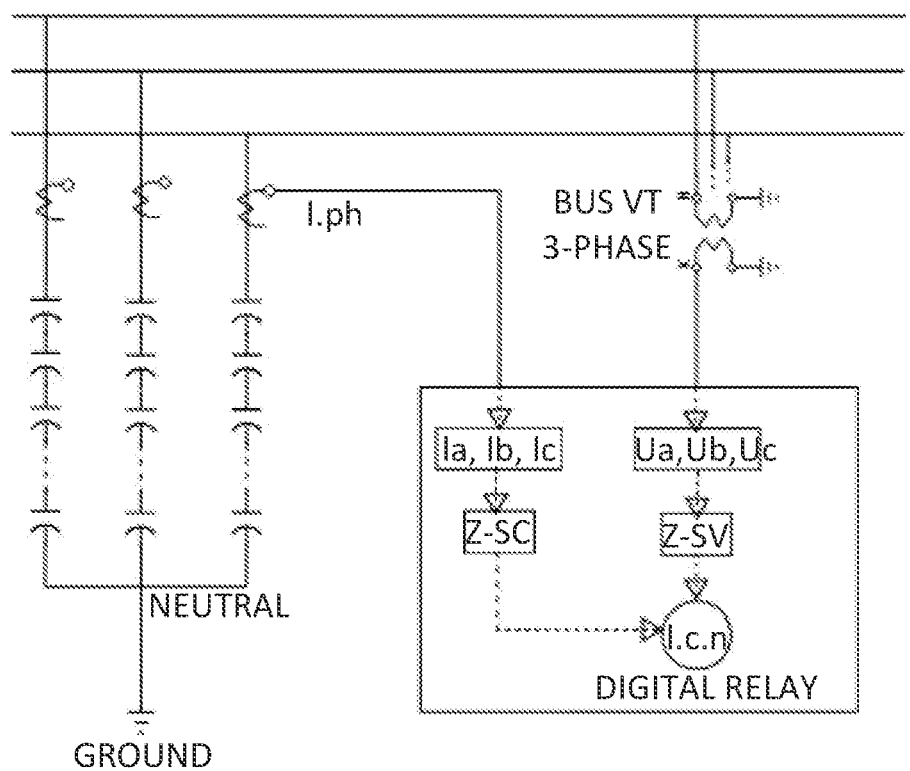
FIG. 3 is a schematic view of a grounded capacitor bank with compensated zero-sequence current unbalance protection using phase currents.

Referring to FIG. 3, three-phase CT on the bus side of the bank and three-phase bus VT signals are wired to the digital relay. The phase CT provides three-phase currents for multiple functions such as phase and ground over-current protections. The three-phase bus VTs are usually available by default as it is commonly used for other applications such as line distance protection, voltage protection, or metering. Usually, it's already connected to the capacitor bank's multi-function digital relay as over-voltage and under-voltage protection are standard protection requirements for most capacitor banks. This new method does not need any additional instrument transformers. From the three-phase CTs, zero-sequence current can be calculated internally by the digital relay, typically available to program for many newer digital relay models on the market. With the AC input in FIG. 3, both zero-sequence and negative-sequence analogs can be available.

Figure 4:
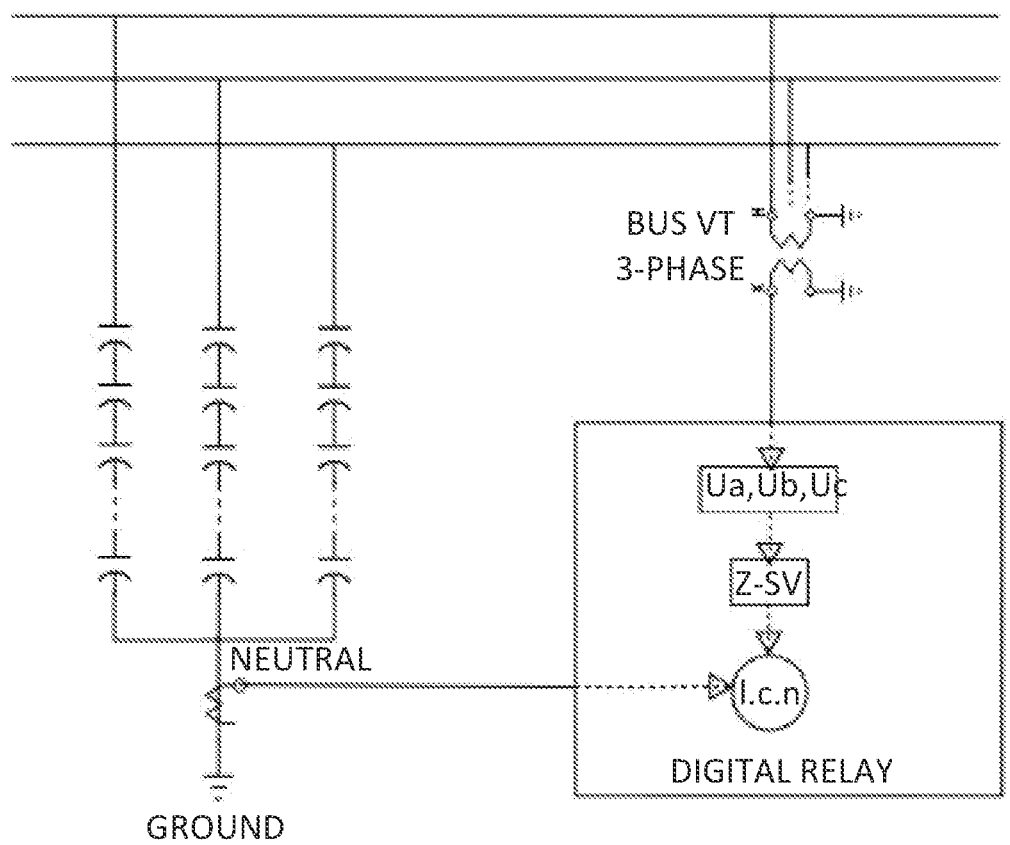
FIG. 4 is a schematic view of a grounded capacitor bank with compensated zero-sequence current unbalance protection using neutral currents.

Referring to FIG. 4, instead of using the phase CT, a neutral CT from the bank neutral conductor is wired to the relay. The neutral CT is usually inexpensive due to low insulation levels and very easy to install. From the neutral CT, the relay can sense the neutral current In. For an external system unbalance, such as a nearby single-phase-to-ground line fault; theoretically, the zero-sequence current calculated by the relay should equal the measurement from the neutral CT. From the bus VT, the relay can sense the three-phase bus voltages; from the three-phase voltages, the digital relay can derive the zero-sequence voltage internally.

Using Zero-Sequence Current and Voltage

Referring to FIG. 3 and FIG. 4, in general, a capacitor element failure causes an unbalance situation in three-phase banks. This unbalanced situation can be reflected in capacitor currents. A zero-sequence current (Z-SC) rises when an element failure occurs on one phase of the bank. An element failure in a capacitor bank may be identified by using the zero-sequence current, and a zero-sequence voltage (Z-SV). Zero-sequence current is calculated by utilizing capacitor bank phase current measurements. The capacitor bank phase current is measured using methods known to a person skilled in the art. Zero-sequence voltage is calculated by utilizing three-phase voltage measurements from a three-phase bus voltage transformer. The zero-sequence voltage is measured using methods known to a person skilled in the art. A compensated unbalance current is calculated using a predetermined capacitor bank nominal impedance number, the zero-sequence current, and the zero-sequence voltage.

The calculated compensated unbalance current is compared to a predetermined acceptable range to determine if a capacitor bank element failure has occurred. The predetermined capacitor bank nominal impedance number is predetermined at the time of building of the capacitor bank and is dependent on the specifications of each capacitor bank. The predetermined capacitor bank nominal impedance number is identifiable by a person skilled in the art. The predetermined acceptable range of the compensated unbalance current is precalculated by an electrical engineer based on the unbalance current value when one or more capacitor elements fail.

Zero-sequence current (Z-SC) may be calculated using the following:

$$\begin{aligned}\text{Zero-sequence current} &= Ua/(Z \cdot ph - \Delta Z) + Ub/Z \cdot ph + Uc/Z \cdot ph \\ &= \frac{(Ua/Z \cdot ph) * (Z \cdot ph/(Z \cdot ph - \Delta Z)) +}{Ub/Z \cdot ph + Uc/Z \cdot ph},\end{aligned}$$

Where—Ua, Ub, and Uc are the phase voltages on the bus;

Z.ph is the nominal phase impedance;

$\Delta Z$ is the impedance change caused by the element failure.

During balanced operation conditions, the three-phase voltages are 120° apart from each other. Depending on a generators' rotating direction in the system, it's assumed that there is an ABC phase rotation, where:

Ua=U.ph×1

Ub=U.ph×$\propto^2$

Uc=U.ph×$\propto$,

Where—U.ph is the nominal phase current magnitude; and

"$\propto$" is the unit vector with 120°, $\propto + \propto^2 + 1 = 0$ (or $\propto + \propto^2 = -1$)

Zero-sequence voltage (Z-SV) is calculated using the equation zero-sequence voltage=Ua+Ub+Uc. In a balanced operation situation, the zero-sequence voltage is zero. In other words, Ua+Ub+Uc=0. This makes the zero-sequence current=U.ph/Z.ph ((Z.ph/(Z.ph–$\Delta Z$)+$\propto$+$\propto^2$).

Nominal phase current may be calculated using the equation I.ph=U.ph/Z.ph.

Zero-sequence current may be calculated using the equations:

$$\begin{aligned}\text{Zero-sequence current} &= U \cdot ph/Z \cdot ph((Z \cdot ph/(Z \cdot ph - \Delta Z) - 1) \\ &= I \cdot ph((Z \cdot ph - Z \cdot ph + \Delta Z)/(Z \cdot ph - \Delta Z)) \\ &= I \cdot ph(\Delta Z/(Z \cdot ph - \Delta Z))\end{aligned}$$

An example, if the $\Delta Z$=0.1 pu of Z.ph, then the zero-sequence current is equal to ⅑ pu of nominal phase current. This impedance change causes small current change at the faulted phase but has no impact to the other two phases. This results in a zero-sequence current and a neutral current.

Since the element failure does not create a phase to ground or phase to phase fault, the phase current does not flow away from the faulted phase. Therefore, the neutral CT's measured current should equal the calculated zero-sequence current at the high voltage HV side CT.

When the system operates in balance in three phases, the zero-sequence voltage is zero. Ideally, the zero-sequence current can be used to operate for either an alarm or a trip if it is above a predetermined acceptable range.

A system imbalance can cause an increase of zero-sequence current and may be seen as a steady voltage unbalance due to unbalanced distribution loading. A single-phase-to-ground fault on a nearby feeder is also a common type of system unbalance.

When there is no element failure in the capacitor bank, the unbalance protection must cancel the adverse impact from the external system imbalance to prevent a false alarm, a trip or a misoperation. This is achieved using the following equation:

$$I.c.n = I.n - (\text{zero-sequence voltage})/Z.ph; \text{ where:}$$

I.c.n is the compensated zero-sequence or neutral current;
I.n is the calculated zero-sequence current or measured neutral current;
Z.ph is the nominal phase impedance of the capacitor bank If the system has a voltage imbalance caused by system reasons while there is no element failure I the capacitor bank, the zero-sequence bus voltage and the zero-sequence current have a relation as follows:

$$I \cdot n = Ua/Z \cdot ph + Ub/Z \cdot ph + Uc/Z \cdot ph$$
$$= (Ua + Ub + Uc)/Z \cdot ph$$
$$= (\text{zero-sequence voltage})/Z \cdot ph$$

Therefore, the compensated neutral current is equal to zero amps, the compensated I.n is not affected by external system voltage imbalance. A short time delay may be applied before an alarm is set off or a trip command is made to the capacitor bank breaker when an unbalance current or voltage exceeds the predetermined acceptable range. The time delay aims to avoid misoperation during switching or a system transient. Unbalanced protection trips should wait a short time of 0.3-5 seconds before being initiated.

To improve security and sensitivity, analog and digital filters may be applied to the capacitor bank phase current and three-phase voltages.

In one embodiment, the zero-sequence current can be measured directly using a current transformer installed on a conductor between a capacitor bank neutral and a capacitor bank ground. When the zero-sequence current is measured directly, that specific value may be used in lieu of the calculated zero-sequence current.

Using Negative-Sequence Current and Voltage

Using a negative-sequence current and negative-sequence voltage leads to the same or similar results as the zero-sequence quantities. A negative-sequence current also reflects an unbalanced operating condition. A negative-sequence voltage can also reflect a system unbalance disturbance event. An element failure in a capacitor bank may be identified by using the negative-sequence current, and a negative-sequence voltage. Negative-sequence current is calculated by utilizing capacitor bank phase current measurements. The capacitor bank phase current is measured using methods known to a person skilled in the art. Negative-sequence voltage is calculated by utilizing three-phase voltage measurements from a three-phase bus voltage transformer. The negative-sequence voltage is measured using methods known to a person skilled in the art. A compensated unbalance current is calculated using a predetermined capacitor bank nominal impedance number, the negative-sequence current, and the negative-sequence voltage. The calculated compensated unbalance current is compared to a predetermined acceptable range to determine if a capacitor bank element failure has occurred. The predetermined capacitor bank nominal impedance number is predetermined at the time of building of the capacitor bank and is dependent on the specifications of each capacitor bank. The predetermined capacitor bank nominal impedance number is identifiable by a person skilled in the art. The predetermined acceptable range of the compensated unbalance current is precalculated by an electrical engineer based on the unbalance current value when one or more capacitor elements fail.

Compensated negative-sequence current may be calculated using the following:

$$I.c.2 = (\text{negative-sequence current}) - (\text{negative-sequence voltage})/Z.ph; \text{ where}$$

I.c.2 is the compensated negative-sequence current
Z.ph is the nominal phase impedance of the capacitor bank The negative-sequence current can be calculated from the measured phase current using a symmetrical component method. Typically, three times of quantity is used.

$$\text{negative-sequence current} = Ia + Ib \times \alpha^2 + Ic \times \alpha; \text{ where}$$

"$\alpha$" is the unit vector with 120°, $\alpha + \alpha^2 + 1 = 0$ (or $\alpha + \alpha^2 = -1$)
Ia, Ib, Ic are the measured current on each phase A, B, C
The negative-sequence voltage can be calculated from the measured phase voltage using a symmetrical component method. Typically, three times of quantity is used.

$$\text{negative-sequence voltage} = Ua + Ub \times \alpha^2 + Uc \times \alpha; \text{ where}$$

"$\alpha$" is the unit vector with 120°, $\alpha + \alpha^2 + 1 = 0$ (or $\alpha + \alpha^2 = -1$)
Ua, Ub, Uc are the measured voltages on each phase A, B, C on the bus The compensated I.c.2 is not affected by external system voltage imbalance. A short time delay may be applied before an alarm is set off or a trip command is made to the capacitor bank breaker when an unbalance current or voltage exceeds the predetermined acceptable range. The time delay aims to avoid misoperation during switching or a system transient. Unbalanced protection trips should wait a short time of 0.3-5 seconds before being initiated.

To improve security and sensitivity, analog and digital filters may be applied to the capacitor bank phase current and three-phase voltages.

One benefit of this method is to create a protection scheme for capacitor banks that does not require the installation of three single-phase voltage transformers in the middle or bottom part of the capacitor banks.

Any use herein of any terms describing an interaction between elements is not meant to limit the interaction to direct interaction between the subject elements, and may also include indirect interaction between the elements such as through secondary or intermediary structure unless specifically stated otherwise.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent that changes may be made to the illustrative embodiments, while falling within the scope of the invention. As such, the scope of the following claims should not be limited by the preferred embodiments set forth in the examples and drawings described above, but should be given the broadest interpretation consistent with the description as a whole.

What is claimed is:

1. A method for identifying element failure in capacitor banks, comprising the steps of:
    measuring a capacitor bank phase current;
    calculating a zero-sequence current using the capacitor bank phase current;
    measuring a three-phase voltage from a three-phase bus voltage transformers;
    calculating a zero-sequence voltage using the three-phase voltage;
    calculate a compensated unbalance current using a predetermined capacitor bank nominal impedance number, the zero-sequence current, and the zero-sequence voltage; and
    comparing the compensated unbalance current to a predetermined acceptable range, a capacitor bank element failure being identified where the compensated unbalance current is outside the predetermined acceptable range.

2. The method of claim 1 comprising a further step of applying an analog filter to the capacitor bank phase current.

3. The method of claim 1 comprising a further step of applying a digital filter to the capacitor bank phase current.

4. The method of claim 1 comprising a further step of applying an analog filter to the three-phase voltages.

5. The method of claim 1 comprising a further step of applying a digital filter to the three-phase voltages.

6. The method of claim 1 comprising a further step of setting off an alarm or a trip when the capacitor bank element failure is identified.

7. The method of claim 6 comprising a further step of applying a time delay prior to setting off the alarm or the trip to avoid a false alarm or a false trip.

8. The method of claim 1 wherein the predetermined acceptable range of the compensated unbalance current is precalculated by an electrical engineer.

9. The method of claim 1 wherein the compensated unbalance current is calculated using the equation $$I.c.n = I.n - (\text{zero-sequence voltage})/Z.ph;$$

where I.c.n is the compensated zero-sequence or neutral current, l.n. is the calculated zero-sequence current, and Z.ph is the nominal phase impedance of the capacitor bank.

10. A method for identifying element failure in capacitor banks, comprising the steps of:
    measuring a zero-sequence current using a current transformer installed on a conductor between a capacitor bank neutral and a capacitor bank ground;
    measuring a three-phase voltage from a three-phase bus voltage transformers;
    calculating a zero-sequence voltage using the three-phase voltage;
    calculate a compensated unbalance current using a predetermined capacitor bank nominal impedance number, the zero-sequence current, and the zero-sequence voltage; and
    comparing the compensated unbalance current to a predetermined acceptable range, a capacitor bank element failure being identified where the compensated unbalance current is outside the predetermined acceptable range.

11. The method of claim 10 comprising a further step of setting off an alarm or a trip when the capacitor bank element failure is identified.

12. The method of claim 11 comprising a further step of applying a time delay prior to setting off the alarm or the trip to avoid a false alarm or a false trip.

13. The method of claim 10 wherein the predetermined acceptable range of the compensated unbalance current is precalculated by an electrical engineer.

14. The method of claim 10 wherein the compensated unbalance current is calculated using the equation $$I.c.n = I.n - (\text{zero-sequence voltage})/Z.ph;$$

where I.c.n. is the compensated zero-sequence or neutral current, l.n. is the measured neutral current, and Z.ph is the nominal phase impedance of the capacitor bank.

15. A method for identifying element failure in capacitor banks, comprising the steps of:
    measuring a capacitor bank phase current;
    calculating a negative-sequence current using the capacitor bank phase current;
    measuring a three-phase voltage from a three-phase bus voltage transformer;
    calculating a negative-sequence voltage using the three-phase voltage;
    calculate a compensated unbalance current using a predetermined capacitor bank nominal impedance number, the negative-sequence current, and the negative-sequence voltage; and
    comparing the compensated unbalance current to a predetermined acceptable range, a capacitor bank element failure being identified where the compensated unbalance current is outside the predetermined acceptable range.

16. The method of claim 15 comprising a further step of applying an analog filter to the capacitor bank phase current.

17. The method of claim 15 comprising a further step of applying a digital filter to the capacitor bank phase current.

18. The method of claim 15 comprising a further step of applying an analog filter to the three-phase voltages.

19. The method of claim 15 comprising a further step of applying a digital filter to the three-phase voltages.

20. The method of claim 15 comprising a further step of setting off an alarm or a trip when the capacitor bank element failure is identified.

21. The method of claim 20 comprising a further step of applying a time delay prior to setting off the alarm or the trip to avoid a false alarm or a false trip.

22. The method of claim 15 wherein the predetermined acceptable range of the compensated unbalance current is precalculated by an electrical engineer.

23. The method of claim 15 wherein the compensated unbalance current is calculated using the equation $$I.c.n2 = I.n - (\text{zero-sequence voltage})/Z.ph;$$

where $I_{c,2}$ is the compensated negative-sequence current and $Z_{ph}$ is the nominal phase impedance of the capacitor bank.

\* \* \* \* \*